(12) United States Patent
Ling et al.

(10) Patent No.: US 10,996,927 B2
(45) Date of Patent: May 4, 2021

(54) RANDOM NUMBER GENERATOR AND METHOD OF FABRICATING THE SAME

(71) Applicant: NATIONAL UNIVERSITY OF SINGAPORE, Singapore (SG)

(72) Inventors: Euk Jin Alexander Ling, Singapore (SG); James Anthony Grieve, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 60 days.

(21) Appl. No.: 16/467,315

(22) PCT Filed: Dec. 5, 2017

(86) PCT No.: PCT/SG2017/050597
§ 371 (c)(1),
(2) Date: Jun. 6, 2019

(87) PCT Pub. No.: WO2018/106183
PCT Pub. Date: Jun. 14, 2018

(65) Prior Publication Data
US 2020/0310759 A1    Oct. 1, 2020

Related U.S. Application Data

(60) Provisional application No. 62/430,509, filed on Dec. 6, 2016.

(51) Int. Cl.
*G06F 7/58* (2006.01)

(52) U.S. Cl.
CPC ................................ *G06F 7/588* (2013.01)

(58) Field of Classification Search
CPC .................................................. G06F 7/58–588
USPC .................................................. 708/250–256
See application file for complete search history.

(56) References Cited

U.S. PATENT DOCUMENTS 8,949,300 B2 * 2/2015 Tanaka .................. H04L 9/0838
708/255

FOREIGN PATENT DOCUMENTS

| CN | 104216678 A | 12/2014 |
| KR | 20180125755 A | * 11/2018 |

OTHER PUBLICATIONS

F. Wang et al., "Robust Quantum Random Number Generator Based on Avalanche Photodiodes," Journal of Lightwave Technology, vol. 33, No. 15, pp. 3319-3326, Aug. 2015 (Year: 2015).*

(Continued)

*Primary Examiner* — Matthew D Sandifer
(74) *Attorney, Agent, or Firm* — Volpe Koenig

(57) ABSTRACT

A random number generator, RNG, a method of fabricating the same, and a method of generating a random number. The RNG, comprises at least one first avalanche photodiode, APD, configured for producing "1" events based on dark electron initiated avalanches in the first APD; at least one second avalanche photodiode, APD, configured for producing "0" events based on dark electron initiated avalanches in the second APD; and a feedback circuit configured for substantially evening out the respective numbers of generated avalanches in the first and second APDs by independently controlling respective dynamic bias voltages of the first and second APDs.

17 Claims, 3 Drawing Sheets

(56) References Cited

OTHER PUBLICATIONS

Tawfeeq, S.K., A Random Number Generator Based on Single-Photon Avalanche Photodiode Dark Counts. Journal of Lightwave Technology, Dec. 15, 2009, vol. 27, No. 24, pp. 5665-5667 [Retrieved on Feb. 22, 2018]<DOI: 10.1109/JLT.2009.2034119> abstract; p. 5666, section III, experiment and results; figure 2.

Wang, F-X., et al., Robust Quantum Random Number Generator Based on Avalanche Photodiodes, Journal of Lightwave Technology, Aug. 1, 2015, vol. 33, No. 15, pp. 3319-3326 [Retrieved on Feb. 22, 2018]<DOI: 10.1109/JLT.2015.2432803> the whole document, in particular section III, experimental setup and figure 3.

Tan, Y., et al. Silicon avalanche photodiode operation and lifetime analysis for small satallites. Optics Express, vol. 21, Issue 14, pp. 16496-16954 (2013).

Tan, Y., Radiation tolerance of opto-electronic components proposed for space-based quantum key distribution. Journal of Modern Optics, 2015, vol. 62, No. 20, 1709-1712.

\* cited by examiner

RANDOM NUMBER GENERATOR AND METHOD OF FABRICATING THE SAME

FIELD OF INVENTION

The present invention relates broadly to random number generator and method of fabricating the same.

BACKGROUND

Any mention and/or discussion of prior art throughout the specification should not be considered, in any way, as an admission that this prior art is well known or forms part of common general knowledge in the field.

Random number generators (RNG) fall into two general categories: software-based and hardware-based. There is a growing awareness of the limitations of software-based RNGs due to the fact that these rely on algorithms and are sensitive to the initial seed. The output of a typical software RNG in general computing is typically of low quality, as they generally try to harvest the input seed from events (such as keystrokes and background computing processes) that may be highly correlated.

Physical or hardware based RNGs in turn tend not to suffer from these problems as they typically rely on very complicated physical processes that rely on complex internal dynamics of particles or states, which are difficult to predict. Examples of these RNGs include sampling Johnson noise, or current fluctions in a diode of some kind. Typically, these RNGs provide some fluctuation that is analogue in nature, requiring some software processing to produce a digitized random number that is useful in general computing.

A recent trend has been to try and identify quantum processes to use as a resource for Quantum RNGs. In these processes, there are both analogue and "digitized" options. An example of a "digitized" format is the approach where single photon detectors monitor single photon pulses falling on an even-probability beamsplitter [1], so that the output of each arm is converted into a 1 or 0. Furthermore, there is theoretical interest in certifiable RNGs, where it is possible to certify the randomness behind the physical process as quantum and not just based on physical chaotic processes.

All the above physical RNGs suffer some disadvantage. The classical analogue RNGs do not provide an output that is native to general computing, relying heavily on software to produce a useable random number. The quantum processes typically require some kind of particle source in addition to the detectors, raising the cost of production. Although some of the above devices are already available in a commercial setting, it is not foreseen that there will be a significant uptake from the general computing market due to the complexity of implementation, and hence increased cost.

Embodiments of the present invention seek to address at least one of the above problems.

SUMMARY

In accordance with a first aspect of the present invention, there is provided a random number generator, RNG, comprising at least one first avalanche photodiode, APD, configured for producing "1" events based on dark electron initiated avalanches in the first APD; at least one second avalanche photodiode, APD, configured for producing "0" events based on dark electron initiated avalanches in the second APD; and a feedback circuit configured for substantially evening out the respective numbers of generated avalanches in the first and second APDs by independently controlling respective dynamic bias voltages of the first and second APDs.

Preferably, the first and second APDs exhibit respective band gaps engineered to increase the rate of the dark electron initiated avalanches.

In accordance with a second aspect of the present invention, there is provided a method of fabricating a random number generator, RNG, comprising providing at least one first avalanche photodiode, APD, configured for producing "1" events based on dark electron initiated avalanches in the first APD; providing at least one second avalanche photodiode, APD, configured for producing "0" events based on dark electron initiated avalanches in the second APD; and providing a feedback circuit configured for substantially evening out the respective numbers of generated avalanches in the first and second APDs by independently controlling respective dynamic bias voltages of the first and second APDs.

Preferably, the method comprises engineering respective band gaps of the first and second APDs to increase the rate of the dark electron initiated avalanches.

In accordance with a third aspect of the present invention, there is provided a method of generating a random number using the RNG of the first aspect.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
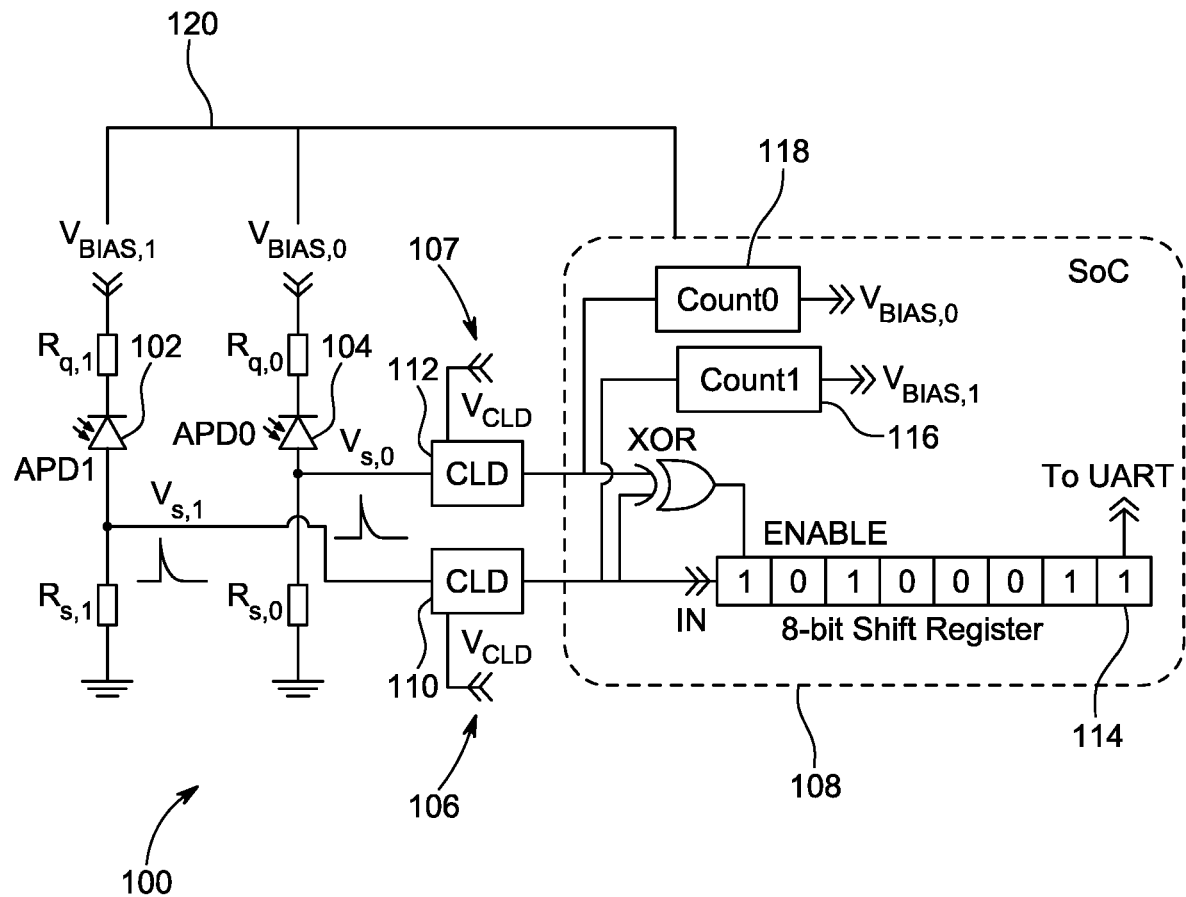
FIG. 1 shows a schematic drawing of a random number generator according to an example embodiment.

The single photon detector used in example embodiments described herein is known as a Geiger mode avalanche photodiode (GM-APD). These devices are designed to emit a current pulse when an incoming photon is absorbed. The current pulse of GM-APDs are essentially digitized, hence, it is native to general computing processes. Pulses emitted by a GM-APD are conditional on a charged particle being present in the avalanche region of the device. When this charged particle is due to an impinging photon, it is a photo-electron. Similarly, when electrons from the valence band are spontaneously promoted into the avalanche region, a dark avalanche or dark pulse is generated. It is unfeasible to distinguish between an avalanche caused by a photoelectron and a dark electron. Example embodiments of the present invention leverage the random timing of these dark electron pulses (so-called "dark counts") to generate random numbers. This has the advantage that no external particle source is necessary—the particles generating the current pulses are already contained within the GM-APD.

In some example embodiments, additional energy levels can also be engineered into the bandgap of the GM-APD. These additional energy levels advantageously provide a pathway for low energy electrons from the valance band to reach the conduction band within the avalanche region.

In a typical scenario where the GM-APD is used to detect single photons, dark counts are suppressed by cooling and by growing active areas that have few defects. Embodiments of the present invention work in the opposite regime. RNGs according to example embodiments will harness dark electrons, and use GM-APDs that preferably have a high probability of dark electron population. Such devices can be fabricated via CMOS processes or by exposing commercial-off-the-shelf (COTS) devices to a controlled amount of non-ionizing radiation, as is understood in the art. By encapsulating the devices in an opaque material or otherwise enclosing them in an opaque housing in example embodiments, any possibility of outside interference with the output random pulses can preferably be eliminated, as will be appreciated by a person skilled in the art.

By embedding such devices in a general computing environment, the RNG according to example embodiments can utilize waste heat to promote dark electrons into the avalanche region. Embodiments of the present invention are also referred to as the Dark Electron RNG (DERNG) herein.

The DERNGs according to example embodiments utilize multiple devices engineered for a high rate of dark electron initiated avalanches.

By using multiple devices according to example embodiments, each GM-APD can advantageously be tuned separately via bias voltage, temperature and/or avalanche discriminator voltage to control the rate of dark electron events and eliminate rate bias between them. Independent devices will give rise to independent rates. In preferred embodiments engineering measures are taken to ensure optical and electronic cross-talk is absent.

The avalanche pulses are used to generate random numbers by appropriate labelling of the detectors in example embodiments, such that e.g. if a pair of GM-APDs is used in one embodiment, events sourced from one detector are encoded as "1" and events from the other detector are encoded as "0". Because of the independent control of the rate of production from each detector according to example embodiments, intrinsically unbiased sequences can advantageously be produced in this manner.

In some example embodiments the rate of dark events is deliberately increased using one or both of the following:

a. employing ion irradiated devices. Ion irradiation was found to create intermediate energy levels between the conduction and valence band, making it much simpler for electrons to reach the conduction band and initiate an avalanche. By controlling ion irradiation dose, it is possible to have devices that can saturate the control circuit, so a high throughput per device (in the Mega-event per second range) can be guaranteed.

b. employing a controlled CMOS process to generate devices that have intrinsic defects within the avalanche region, similar to that induced by ion, e.g. proton, irradiation. The CMOS process is cheap, and manufacture of the GM-APDs can be readily achieved e.g. by foundries.

Example embodiments of the present invention use two or more GM-APDs as independent processes to produce 1s and 0s. By controlling the rates of the GM-APDs and combining the inputs into an Exclusive-OR gate, the rate at which 1 and 0 appear can be balanced through true hardware unbiasing by adjusting the bias voltage and/or reference voltage. It is noted that temperature control may provide another (slower, less efficient) way to control the dark count rate in some example embodiments.

In the GM-APDs for use in example embodiments the band gap is preferably engineered to increase the rate of dark counts—optionally deliberately targeting a particular rate by careful ion dosing, control of bias voltage and/or the reference voltage that discriminates against the current pulse based on its amplitude. Optionally, temperature may be controlled.

In the DERNG according to example embodiments, two or more GM-APDs are operated in parallel. For example, in one embodiment two GM-APDs are used. The output of the first GM-APD is taken as "1" and the output of the second GM-APD is taken as "0". By trimming the output rate of each GM-APD, the rate of 1 and 0 can be balanced per unit time, enabling a hardware-based unbiasing approach. The throughput of the DERNG can be improved by adding more devices in parallel, according to example embodiments.

It is noted that CMOS devices have low capacitance in their circuitry enabling faster recharge time and so there is an intrinsic boost to the rate of dark counts according to example embodiments.

It will be appreciated that where several GM-APDs are packaged close together according to example embodiments, it is desirable to ensure that there is no or minimum optical or electronic cross-talk between them by appropriate design considerations.

FIG. 1 shows a schematic diagram of device DERNG 100 according to an example embodiment. A pair of GM-APDs 102, 104 are operated in parallel using respective simple passive-quenching circuits 106, 107, with independent and dynamic control over the bias voltages. A microcontroller (or system-on-chip [SoC]) 108 is used to monitor the circuits 106, 107 and extract random bits from the detector output.

Specifically, the GM-APDs 102, 104 are operated in a passively quenched configuration, with independent and dynamic control of their bias voltages $V_{BIAS,1}$ and $V_{BIAS,0}$. Avalanche pulses generated in the GM-APDs 102, 104 are digitized by two constant level discriminator modules 110, 112, before entering the system-on-chip (Cypress PSoC3). An XOR operation rejects time-coincident signals, with uncorrelated signals leading to the storing of a bit in an 8-bit shift register 114 for use by e.g. a universal asynchronous receiver transmitter (UART) (not shown). Bit parity is determined by reference to the source detector. The digital pulses are also accumulated in a pair of counters 116, 118 to determine the respective dark count rates of the GM-APDs 102, 104. A proportional-differential control loop 120 dynamically adjusts the bias voltages to advantageously maintain identical rates according to example embodiments.

The passive-quench circuit e.g. 106 in example embodiments is useful because it enables the user to have 2 levers of control over the avalanche detection probability: bias voltage (avalanche rates increase with bias voltage), and CLD reference voltage (a higher reference voltage discriminates against avalanche of lower amplitude, and vice versa). This allows the output per device to be trimmed accordingly. It is noted that hardware can be added in some embodiments to change the temperature of the detectors independently, and use that to facilitate trimming the rate.

Figure 2:
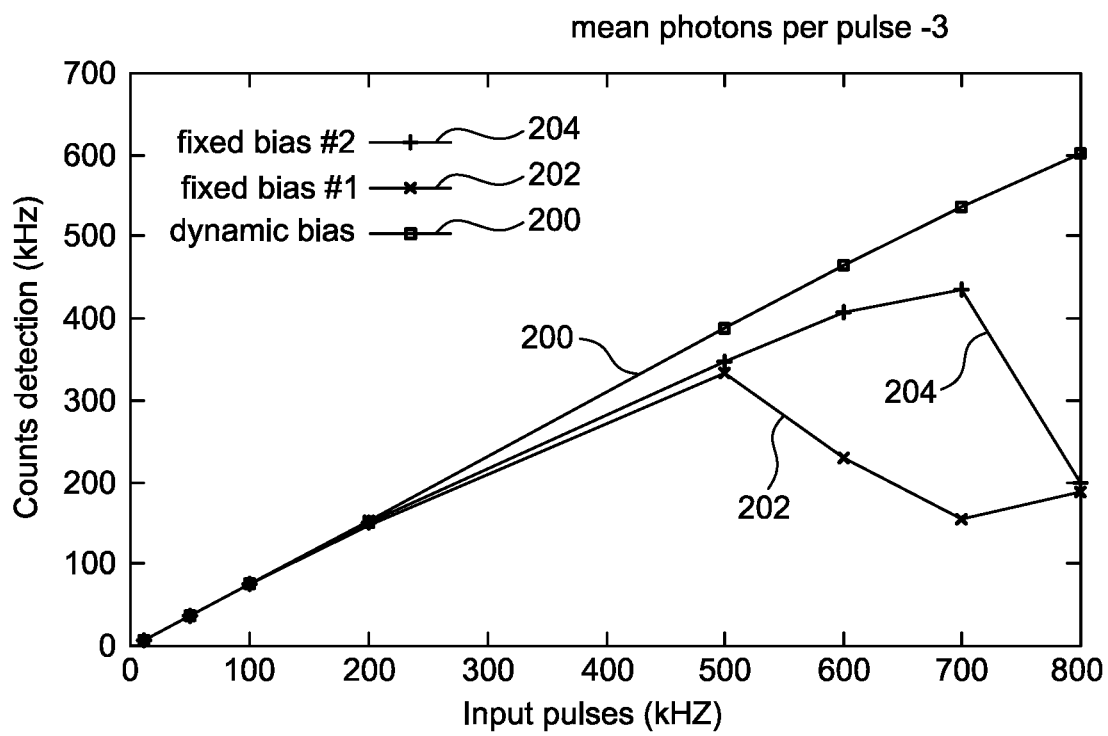
FIG. 2 is a graph illustrating linearity of events detected versus input pulses in Geiger mode avalanche photodiodes with dynamic bias voltage, for use in random number generators according to example embodiments.

FIG. 2 shows that a GM-APD operated with dynamic bias voltage strategy can count up to 800,000 avalanches per second, see curve 200. A fixed bias GM-APD used in prior art devices was observed to start to saturate at 200 kHz and stop operating at either 500 kHz or 600 kHz depending on the analogue pulse amplitude, see curves 202 and 204 for examples of fixed bias behaviour (low and high bias, respectively). The ability to count fast via a passive quenching circuit is desirable because the DERNG preferably should have a large throughput. In the curves 200, the bias voltage was increased at higher rates. It is noted that the data was recorded using photons as the input—this is exactly the same as if dark counts were used, but using photons enables precise knowledge of impinging event rate, while the dark counts would be a random and less controllable process, as will be appreciated by a person skilled in the art. It is also noted that the data was obtained using a window comparator circuit as described in [2], which is an example of a variable bias operation of APDs. The results illustrate that while a fixed bias approach has limitations in the count rate, a dynamic bias preferably allows reaching higher rates. In example embodiments of the present invention, a specific dynamic bias approach is advantageously used, i.e. varying the bias to even out the dark count rates between GM-APDs, e.g. to a fixed rate.

In the GM-APDs for use in example embodiments the probability of a dark electron avalanche can be increased by dosing the device with non-ionizing radiation such as protons or heavy ions that cause displacement damage within the avalanche region. This avalanche region will then have multiple energy levels between the conduction and valence band, advantageously making it easy for an electron of relatively low energy to into the conduction band. Ion irradiation is simple to perform, and easily accessible e.g. in cyclotrons. For example, low energy protons in the 10-20 MeV range were found to be sufficient to create devices with a high background count [3]. As another example, ionizing radiation from Co-60 sources are also possible as a mechanism for increasing energy levels, albeit requiring longer exposure times.

Figure 3:
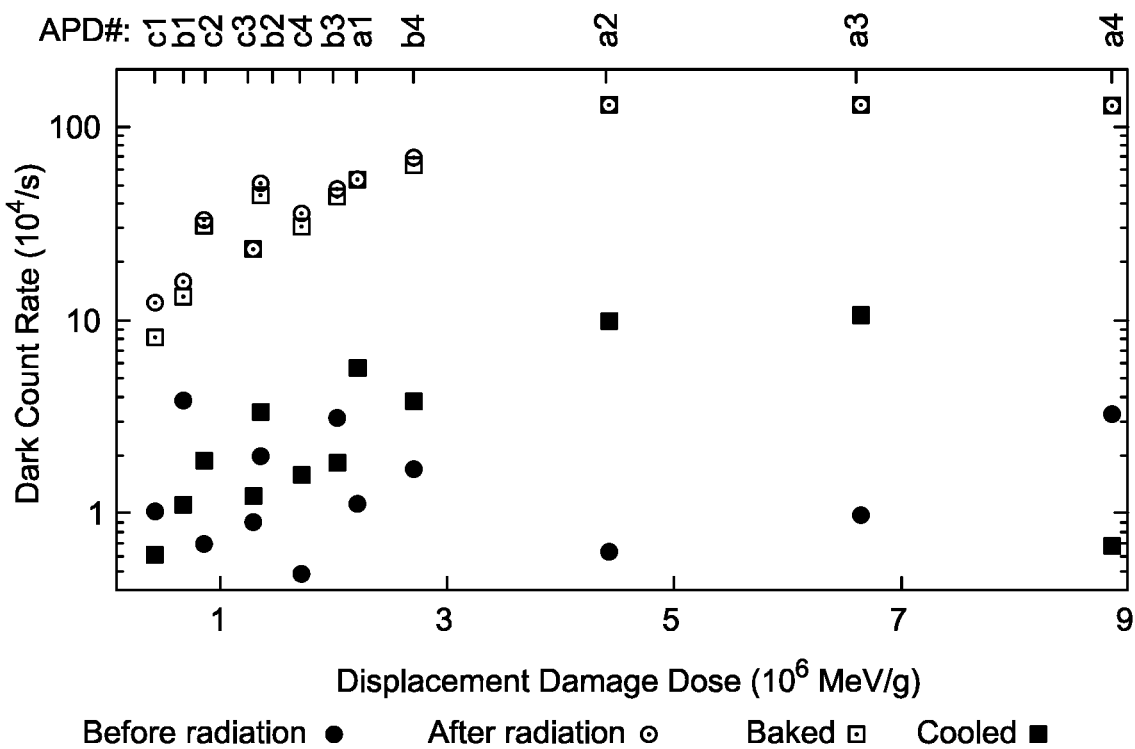
FIG. 3 is a graph illustrating dark count rate versus displacement damage dose for irradiated Geiger mode avalanche photodiodes, for use in random number generators according to example embodiments.

FIG. 3 is a graph taken from [3] showing the dark count rate of twelve GM-APDs irradiated with different doses of protons at room temperature. The dark count rate is highly tunable with temperature. By selecting a careful dose, e.g. at 2 million MeV/g, a dark count rate of 500-800 kHz is possible at room temperature. This is 20-40 times higher than that reported in [4]. In principle, the dark counts can approach several mega-events per second, although this is expected to require high-performance quench circuitry which will consume more power.

Similar rates are available by engineered CMOS devices for GM-APDs according to example embodiments. For the data points relating to the baked samples, the samples were heated up to about 55 degrees Celsius for about 24 Hours and then cooled to room temperature for measurement. For the data points relating to the cooled samples, the samples were cooled down to −20 degrees Celsius and the measurements were taken at that temperature.

Embodiments of the present invention can have one or more of the following features and associated benefits/advantages:

| Feature | Benefit/Advantage |
| --- | --- |
| No external particle source | This can simplify the implementation and lowers the Size, Weight and Power (SWAP) requirements for a physical RNG based on quantum processes. |
| Simple control circuit | Passive quenched GM-APDs can be implemented in a very small form-factor. It is possible to implement these devices in the footprint of a typical USB memory stick as a portable RNG. It is also possible in principle to package the devices into ICs. One embodiment has the passive quenching resistor as part of the GM-APD circuit. |
| Low power | The lack of a particle source can lower the power requirements dramatically. Using COTS GM-APDs, the power consumed for 1 Mega-events per second is less than 0.5 W, and this is using GM-APDs that are not optimized for dark event generation, as is, however, preferably done in example embodiments. CMOS based GM-APDs are intrinsically noisy due to the impurities left in the process, and often require only breakdown voltages slightly more than 20 V, making them very attractive as DERNGs. |
| Continuous Monitoring | Unlike other physical RNG, there is no need for time synchronization with a particle source or sampling time to convert an analog signal into a pulse. With GM-APDs these effects come "for free", i.e. intrinsic to the GM-APDs. There is an intrinsic rate independent of sampling time and effectively the pulses are accumulated as they appear and none are lost. |
| Limited Memory Effect | Most physical RNGs based on Zener diodes, Johnson noise etc, are not based on single electron events and hence, have a tendency to exhibit long-term memory and correlation, causing bias in the output. With GM-APDs, a comparable memory effect is possible in an afterpulse. The afterpulsing effect can be removed entirely in example embodiments due to the use of two or more APDs as they operate independently of each other. |
| Hardware-based unbiasing | In example embodiments, by using multiple devices with their respective rates evened out, true hardware-based unbiasing can be achieved. |
| Temperature dependent throughput | The rate of dark electron avalanches within a GM-APD is strongly correlated with temperature. At room temperature, the intrinsic rate of commercial off-the-shelf (COTS) devices is between 20-40 k-events per second. This rate can be increased dramatically by selecting APDs that have many defects, and intermediate levels between the conduction and valence bands. These intermediate levels raise the likelihood of dark electron promotion to the avalanche region. In fact, the higher the temperature, the more levels become available, increasing the probability of an avalanche per unit time. |

In one embodiment, a random number generator, RNG, comprises at least one first avalanche photodiode, APD, configured for producing "1" events based on dark electron initiated avalanches in the first APD; at least one second avalanche photodiode, APD, configured for producing "0" events based on dark electron initiated avalanches in the second APD; and a feedback circuit configured for substantially evening out the respective numbers of generated avalanches in the first and second APDs by independently controlling respective dynamic bias voltages of the first and second APDs.

The first and second APDs may be coupled to respective quenching circuits for the producing of the "1" and "0" events. The quenching circuits may comprise passive quench circuits. The quenching circuits may comprise active quench circuits. The quenching circuits may be configured with respective discrimination reference voltages chosen to increase the rate of the dark electron initiated avalanches.

The first and second APDs may exhibit respective band gaps engineered to increase the rate of the dark electron initiated avalanches. The first and second APDs may comprise respective chosen ion dosing to increase the rate of the dark electron initiated avalanches.

The RNG may comprise a processor for performing an XOR operation on the "1" and "0" events prior to storing a bit.

Figure 4:
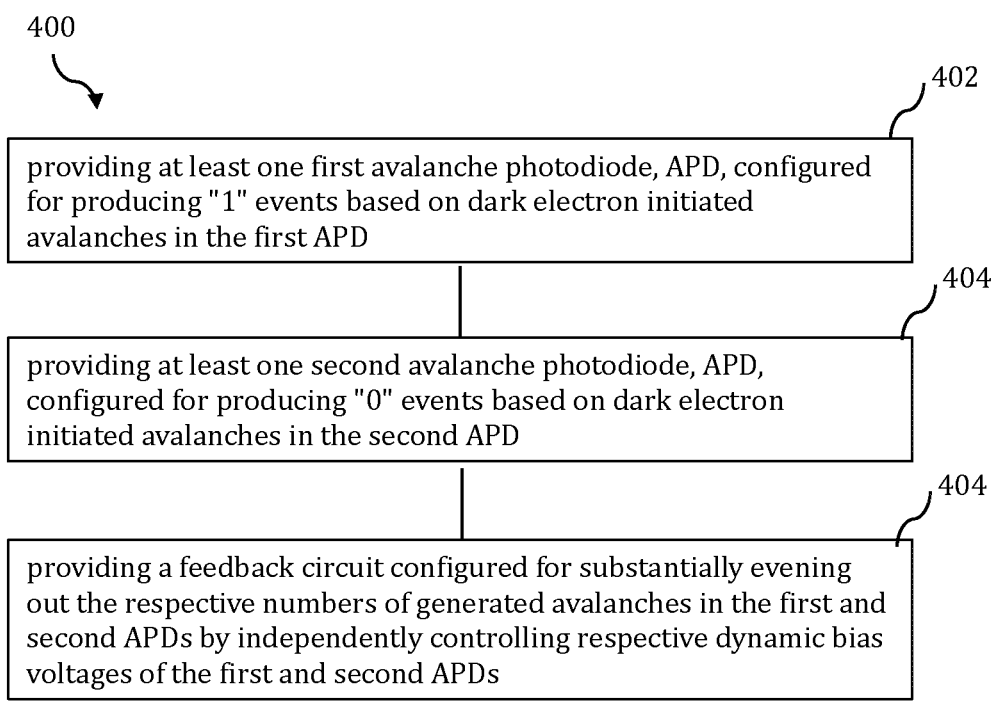
FIG. 4 shows a flowchart illustrating a method of fabricating a random number generator according to an example embodiment.

FIG. 4 shows a flowchart 400 illustrating a method of fabricating a random number generator, RNG, according to an example embodiment. At step 402, at least one first avalanche photodiode, APD, configured for producing "1" events based on dark electron initiated avalanches in the first APD is provided. At step 404, at least one second avalanche photodiode, APD, configured for producing "0" events based on dark electron initiated avalanches in the second APD is provided. At step 406, a feedback circuit configured for substantially evening out the respective numbers of generated avalanches in the first and second APDs by independently controlling respective dynamic bias voltages of the first and second APDs is provided.

The method may comprise coupling the first and second APDs to respective quenching circuits for the producing of the "1" and "0" events. The quenching circuits may comprise passive quench circuits. The quenching circuits may comprise active quench circuits. The method may comprise configuring the quenching circuits with respective discrimination reference voltages chosen to increase the rate of the dark electron initiated avalanches.

The method may comprise engineering respective band gaps of the first and second APDs to increase the rate of the dark electron initiated avalanches. The method may comprise choosing respective chosen ion dosing of the first and second APDs to increase the rate of the dark electron initiated avalanches.

The method may comprise providing a processor for performing an XOR operation on the "1" and "0" events prior to storing a bit.

In one embodiment, a method of generating a random number using the RNG of any of the embodiments described herein is provided.

REFERENCES

[1] Journal of Lightwave Technology, Vol. 33, (15), 3319 (2015)
[2] Optics Express, Vol. 21, Issue 14, pp. 16946-16954 (2013)
[3] Journal of Modern Optics, 2015, Vol. 62, No. 20, 1709-1712
[4] Journal of Lightwave Technology, Vol 27, (24), 5665 (2009)

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the system include: microcontrollers with memory (such as electronically erasable programmable read only memory (EEPROM)), embedded microprocessors, firmware, software, etc. Furthermore, aspects of the system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

The invention claimed is:

1. A random number generator, RNG, comprising:
at least one first avalanche photodiode, APD, configured for producing "1" events based on dark electron initiated avalanches in the first APD;
at least one second avalanche photodiode, APD, configured for producing "0" events based on dark electron initiated avalanches in the second APD;
a microcontroller coupled to the first APD and the second ADP for extracting the "1" events and the "0" events as random bits for generating a random number; and
a feedback circuit configured for evening out the respective numbers of generated avalanches in the first and second APDs by independently controlling respective dynamic bias voltages of the first and second APDs.

2. The RNG of claim 1, wherein the first and second APDs are coupled to respective quenching circuits for the producing of the "1" and "0" events.

3. The RNG of claim 2, wherein the quenching circuits comprise passive quench circuits.

4. The RNG of claim 2, wherein the quenching circuits comprise active quench circuits.

5. The RNG of claim 2, wherein the quenching circuits are configured with respective discrimination reference voltages chosen to increase the rate of the dark electron initiated avalanches.

6. The RNG of claim 5, wherein the first and second APDs comprise respective chosen ion dosing to increase the rate of the dark electron initiated avalanches.

7. The RNG of claim 1, wherein the first and second APDs exhibit respective band gaps engineered to increase the rate of the dark electron initiated avalanches.

8. The RNG of claim 1, comprising a processor for performing an XOR operation on the "1" and "0" events prior to storing a bit.

9. A method of generating a random number using the RNG of claim 1.

10. A method of fabricating a random number generator, RNG, comprising:
   providing at least one first avalanche photodiode, APD, configured for producing "1" events based on dark electron initiated avalanches in the first APD;
   providing at least one second avalanche photodiode, APD, configured for producing "0" events based on dark electron initiated avalanches in the second APD;
   providing a microcontroller coupled to the first APD and the second ADP for extracting the "1" events and the "0" events as random bits for generating a random number; and
   providing a feedback circuit configured for evening out the respective numbers of generated avalanches in the first and second APDs by independently controlling respective dynamic bias voltages of the first and second APDs.

11. The method of claim 10, comprising coupling the first and second APDs to respective quenching circuits for the producing of the "1" and "0" events.

12. The method of claim 11, wherein the quenching circuits comprise passive quench circuits.

13. The method of claim 11, wherein the quenching circuits comprise active quench circuits.

14. The method of claim 11, comprising configuring the quenching circuits with respective discrimination reference voltages chosen to increase the rate of the dark electron initiated avalanches.

15. The method of claim 10, comprising engineering respective band gaps of the first and second APDs to increase the rate of the dark electron initiated avalanches.

16. The method of claim 15, comprising choosing respective chosen ion dosing of the first and second APDs to increase the rate of the dark electron initiated avalanches.

17. The method of claim 10, comprising providing a processor for performing an XOR operation on the "1" and "0" events prior to storing a bit.

* * * * *